United States Patent [19]
Kubinec

[11] Patent Number: 5,852,616
[45] Date of Patent: Dec. 22, 1998

[54] ON-CHIP OPERATING CONDITION RECORDER

[75] Inventor: James Kubinec, Reno, Nev.

[73] Assignee: Advanced Micro Devices, Inc., Sunnyvale, Calif.

[21] Appl. No.: 971,357

[22] Filed: Nov. 17, 1997

[51] Int. Cl.$^6$ ..................................................... G06F 11/00
[52] U.S. Cl. .......................................................... 371/21.1
[58] Field of Search ............................. 371/21.1, 22.1, 371/22.36, 22.5, 22.6, 26

[56] References Cited

U.S. PATENT DOCUMENTS

| | | |
|---|---|---|
| 5,132,572 | 7/1992 | Woo . |
| 5,220,216 | 6/1993 | Woo . |
| 5,227,679 | 7/1993 | Woo . |
| 5,264,745 | 11/1993 | Woo . |
| 5,349,612 | 9/1994 | Guo et al. . |
| 5,363,419 | 11/1994 | Ho . |
| 5,367,542 | 11/1994 | Guo . |
| 5,400,370 | 3/1995 | Guo . |
| 5,451,894 | 9/1995 | Guo . |
| 5,452,333 | 9/1995 | Guo et al. . |
| 5,457,336 | 10/1995 | Fang et al. . |
| 5,457,719 | 10/1995 | Guo et al. . |

Primary Examiner—Vincent P. Canney

[57] ABSTRACT

An operation recorder that stores the operating conditions of an integrated circuit chip. The recorder includes an on-chip oscillator and an external reference clock. The frequencies of these two sources are compared and a value indicating chip operating conditions is output to a memory. The memory contains a number of values which store the operating history of the chip.

16 Claims, 4 Drawing Sheets

ON-CHIP OPERATING CONDITION RECORDER

FIELD OF THE INVENTION

This invention relates to semiconductor devices and more particularly to recording the operating conditions of an integrated circuit chip.

BACKGROUND OF THE INVENTION

In an integrated circuit chip, the various functions performed by the logic elements on the chip are very dependent on variations in chip operating conditions. These chip operating conditions include variables such as chip temperature, chip operating voltage and process variables such as channel conductance and threshold voltage.

When a chip fails to perform properly or crashes, any one of a variety of factors could be the cause. In order to determine the exact cause of a chip failure, complex recorders may be used to store information on the operating state of the chip before the failure. These recorders can store specific information on the chip temperature, chip operating voltages and other process variables. However, this may require the use of analog sensors which can detect and report the status of these variables on a real time basis. The recorders may also store the states of various registers located on the chip at predetermined intervals.

A drawback with such recorders is the large amount of space that they consume on the chip and the increased amount of processing necessary to continually update the status of all the variables. Another drawback is that analog sensors are often sensitive to noise caused by digital switching operations and other factors. Additionally, the cost of such recorders with a number of analog sensors increases with the complexity of the particular device.

In view of the above, a need exists for providing an operating condition recorder which provides an indication of the operating conditions on the chip itself without requiring extensive processing or memory space. It additionally is desirable to provide an operating condition recorder using digital logic elements which can be continuously updated based on the current chip conditions and can be integrated into a digital design.

SUMMARY OF THE INVENTION

A primary object of the invention is to detect variations in the operating conditions of an integrated circuit chip which can be used for diagnostic purposes.

Another object of the invention is to continuously detect variations in chip conditions using digital logic elements that can be integrated into a digital design.

To achieve the foregoing and other objects and advantages, the present invention utilizes an on-chip oscillator circuit and an off-chip reference clock. The on-chip oscillator circuit generates a signal having a nominal frequency which is chosen to be equal the nominal frequency of the reference clock. The off-chip reference clock produces a stable clock signal. A comparator compares the frequencies of the oscillator and the reference clock and outputs a signal indicating the difference in frequency. A memory device coupled to the comparator receives the output from the comparator.

In accordance with one aspect of the invention, the oscillator comprises serially connected delay cells. These delay cells exhibit the same characteristics as the other logic elements on the chip since they are located on the same silicon substrate.

In accordance with another aspect, the number of serially connected delay cells in the oscillator circuit is based upon the propagation delay time of the delay cells under standard operating conditions and the oscillation frequency of the reference clock.

In another aspect of the invention, a counter is coupled to the external clock for generating a pulse every predetermined period of time and the pulse is used to write the current comparator value to the memory device.

In a further aspect, the memory device is used to store a plurality of values from the comparator and the contents of the memory include a value indicating the time that the data comparison is made.

Other objects and advantages of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings and description are to be regarded as illustrative in nature, and not as restrictive.

DETAILED DESCRIPTION OF THE INVENTION

Figure 1:
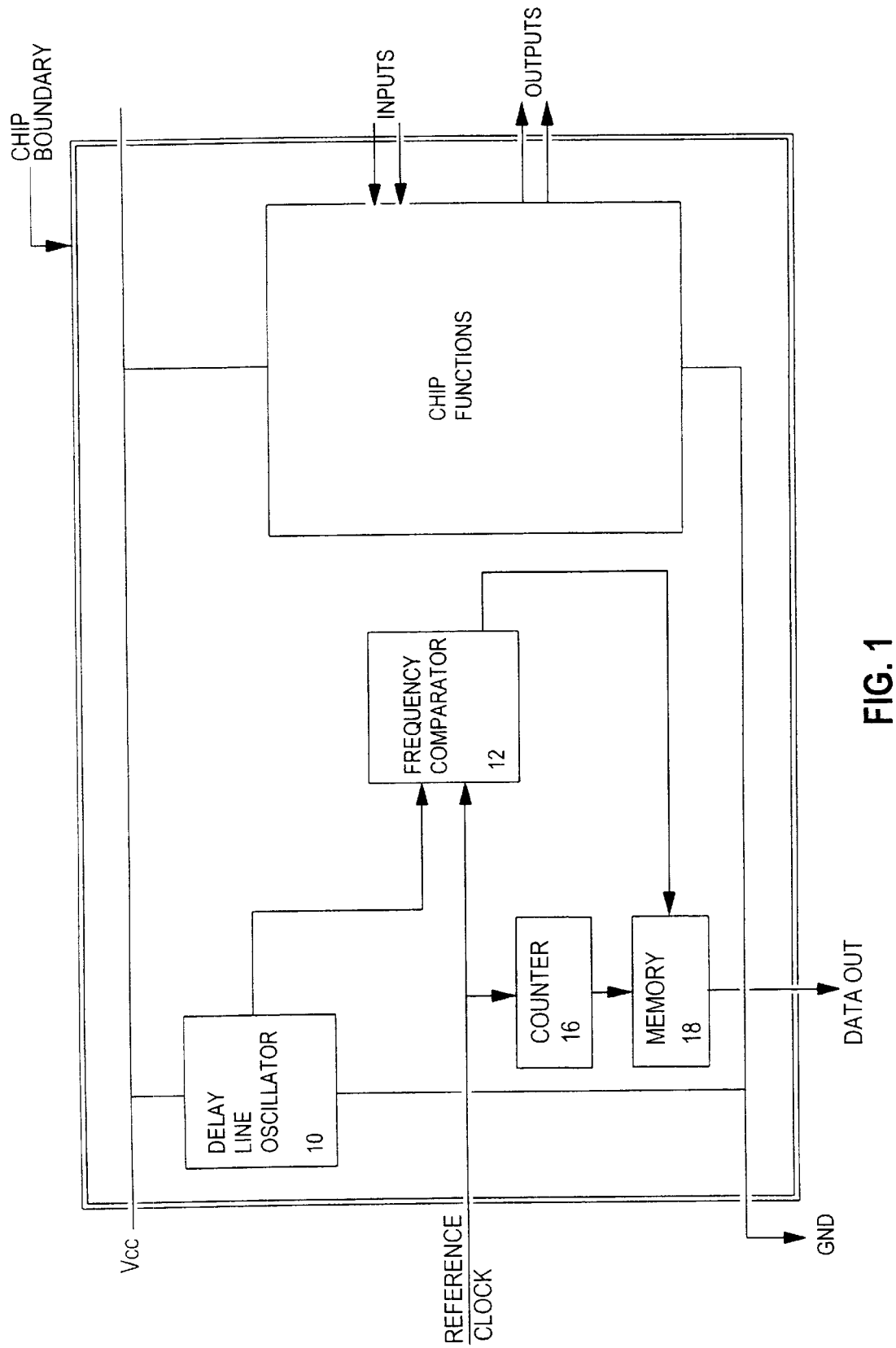
FIG. 1 is a block diagram of a chip operating condition recorder.

FIG. 1 shows a functional block diagram of a chip operating condition recorder system. The delay line oscillator 10 generates a clock signal which is output to frequency comparator 12. The frequency comparator 12 also receives an input from an external reference clock which is located off the chip. The reference clock (not shown) outputs a stable clock signal having a known frequency. The frequency comparator 12 compares the frequency of the reference clock to the frequency of the delay line oscillator 10. A counter 16 coupled to the reference clock generates a pulse every predetermined period of time. The pulse causes the frequency comparator 12 to write its contents to memory 18. The contents of memory 18 may be read out for chip diagnostic purposes.

Figure 4:
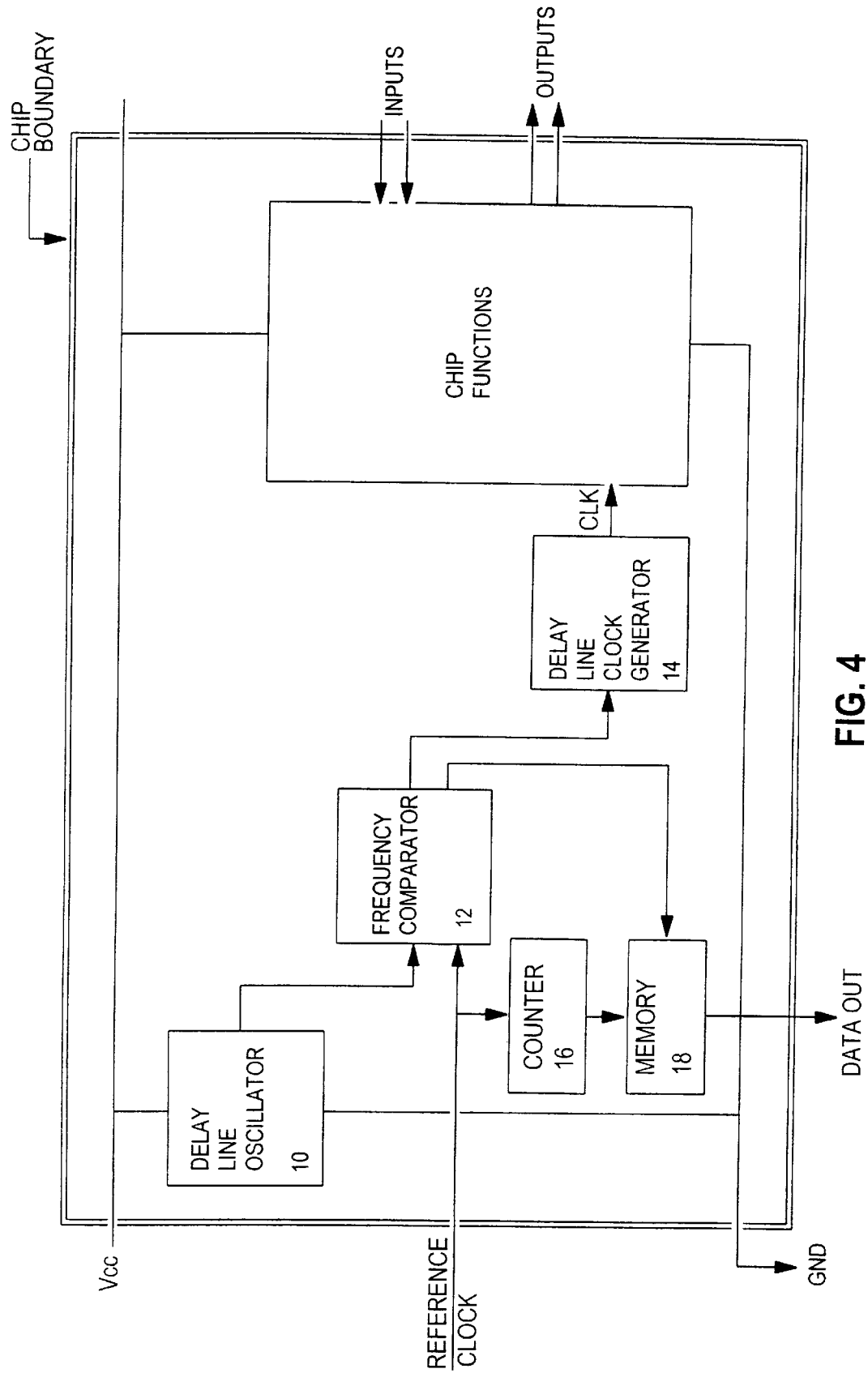
FIG. 4 is a detailed block diagram of the chip operating condition recorder within a design including a clock generator.

Alternatively, the frequency comparator 12 may also output its value to a delay line clock generator 14 shown in FIG. 4, which generates a clock signal that compensates for variations in the chip operating conditions. Details of the delay line oscillator 10 are shown in FIG. 2.

Figure 2:
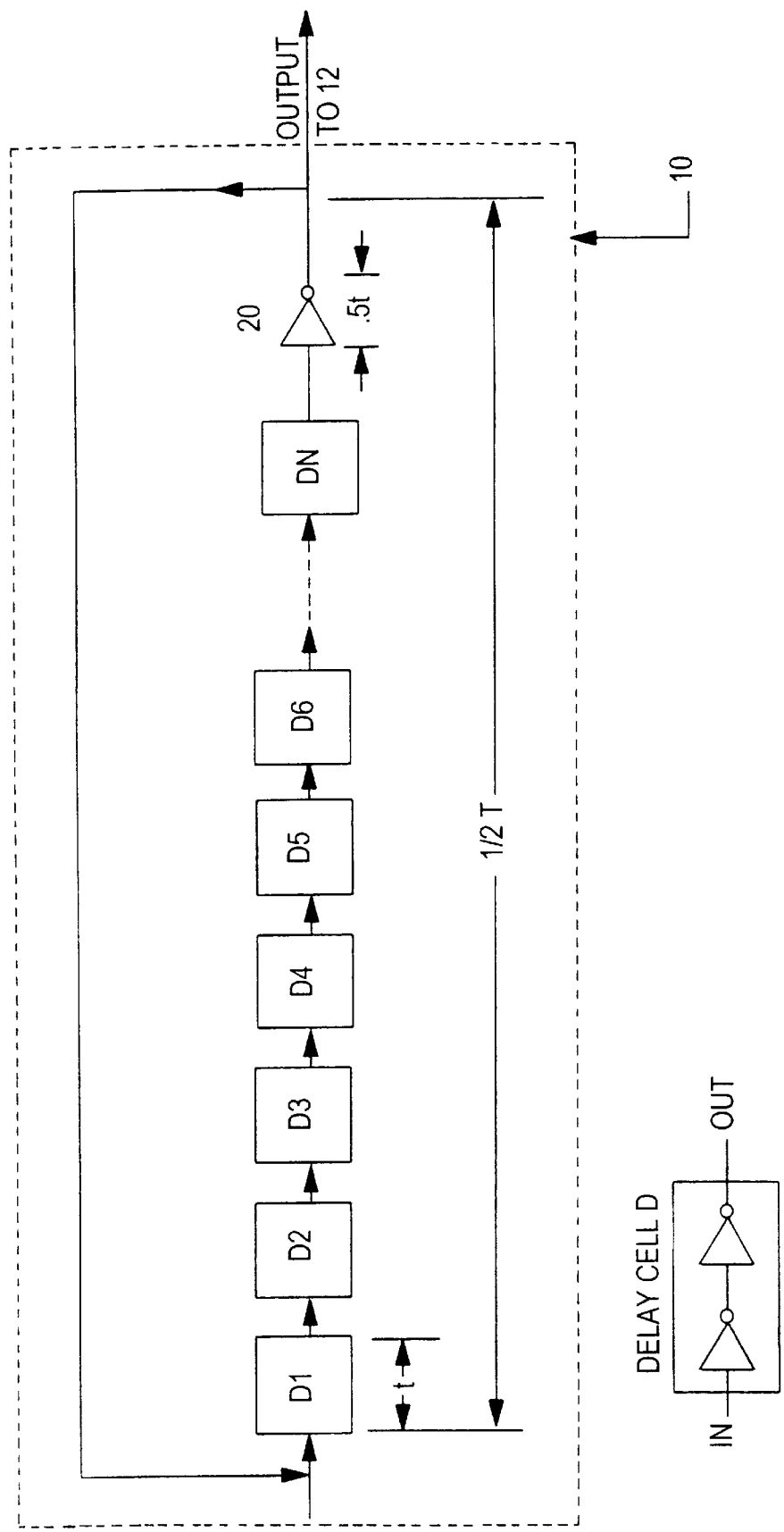
FIG. 2 is a detailed block diagram of the delay line oscillator of FIG. 1.

With reference to FIG. 2, the delay line oscillator 10 is made up of a cascaded array of N delay cells, D1–DN. Each of the individual delay cells D comprises a pair of serially connected inverters. As CMOS and other processing technologies provide greater density of devices on chips, long strings of cascaded inverters can be obtained at lower and lower cost and the inverters can be used as the basic high resolution unit delay element. However, other logic elements may also be used as the basic delay element without departing from the concept of the invention. Examples of cascaded inverters used as high resolution delay elements are in U.S. Pat. Nos. 5,451,894 and 5,457,719, both assigned to the assignee of the present invention.

A signal which propagates through each delay cell D in the delay line oscillator 10 has a nominal propagation delay time, t. The value of t is known for standard operating conditions. Using this known propagation delay time t, a system designer builds the oscillator by cascading N delay cells together to generate a clock signal with a known period.

For example, assume that the reference clock has a period of T, the period of the delay line oscillator 10 also T in order to generate a signal having the same nominal frequency as the reference clock. The number of delay cells cascaded along with inverter 20 totals a delay time of (½)T. From FIG. 2, a "high" signal input to the delay line oscillator 10 propagates down the delay line until the signal reaches the end of the delay line at delay cell DN. At this point, the "high" signal propagates through inverter 20 and the delay line oscillator 10 output switches to "low". This "low" signal is fed back to the beginning of the delay line. The output signal of the delay line oscillator 10 remains "low" until the signal propagates to the end of the delay line where it switches back to "high". This process repeats and alternates the output between "high" and "low". The output signal period is equal to (2)[(Nt+(½)t] or 2Nt+t, where N is the number of cascaded delay cells and t is the delay period for each delay cell under normal operating conditions.

The delay cells in the delay line may be assigned addresses, as described in U.S. Pat. No. 5,457,719, assigned to the assignee of the present invention and incorporated herein by reference. This use of addressing enables the frequency comparator 12 to quickly know the length of the delay line and facilitates calculations made by the frequency comparator 12.

As discussed earlier, as the environmental conditions of the chip change, the propagation delay time of the delay cells changes. In order to determine the actual propagation delay of the delay cells based on the current environmental conditions on the chip, the frequency comparator 12 compares the output of the delay line oscillator 10 to the external reference clock.

The reference clock is located off the chip and normally is a stable crystal reference clock. However, the reference clock can be any type of clocking device which outputs a stable, accurate clock signal.

The frequency comparator 12 counts the number of cycles of the reference clock and the delay line oscillator 10 in a given period of time. The frequency comparator 12 compares the number of cycles of the two clock sources. Using this information, the frequency comparator 12 determines whether the delay line oscillator 10 is operating above or below the frequency of the reference clock. When chip temperature increases, the propagation delay time of the inverters is expected to increase, slowing the rate of operation of the inverters and therefore slowing the rate of the delay line oscillator 10. The frequency comparator 12 determines the actual frequency of the delay line oscillator 10 for the current chip conditions. With the actual frequency of the delay line oscillator 10 known, the frequency comparator 12 determines the actual propagation delay time t, of each delay element through simple calculations, T=(2N+1)t, where T is equal to the actual period of the delay line oscillator 10 and N is equal to the number of delay cells cascaded in the delay line oscillator 10.

The frequency comparator 12 can be any one of many conventional comparator devices which are known in the art. The frequency comparator 12 can be a simple device which counts the number of cycles occurring in a reference period. However, any one of the known frequency comparators is suitable for use in the present invention.

The frequency comparator 12 contains a value which indicates the frequency difference between the reference clock and the delay line oscillator 10 at the time that the comparison is made. This value is an indication of the current operating conditions on the chip because the delay elements are affected by variations in chip temperature, voltage and other process variables.

The change in frequency of the delay line oscillator 10 from the nominal frequency of the reference clock can be decoded into a number of formats. For example, through simple calculations, the frequency comparator 12 may determine the frequency difference, percentage frequency difference, propagation delay difference for the delay cells from the standard value, percentage propagation delay difference for the delay cells from the standard value, etc. Converting the contents of the frequency comparator 12 to these various formats requires simple calculations which would be known to one of ordinary skill in this art and the details are not required for the purposes of this invention.

With reference to FIG. 1, the information in the frequency comparator 12 is output to memory 18 and is written to memory 18 when a load pulse from the counter 16 is received by the memory 18. Alternatively, the output of the frequency comparator 12 may be held at the comparator 12 until a load pulse is received at the frequency comparator 12. This pulse signals the frequency comparator 12 to write its contents to the memory 18.

The counter 16 is coupled to the external clock and generates the load pulse every X seconds. The value of X is dependent upon the particular application needs and is programmable. The counter may also be used to control how often the frequency comparison is made. The counter 16 transmits a load pulse to memory 18 every X seconds which stores a value indicative of the chip conditions at the current time.

Figure 3:
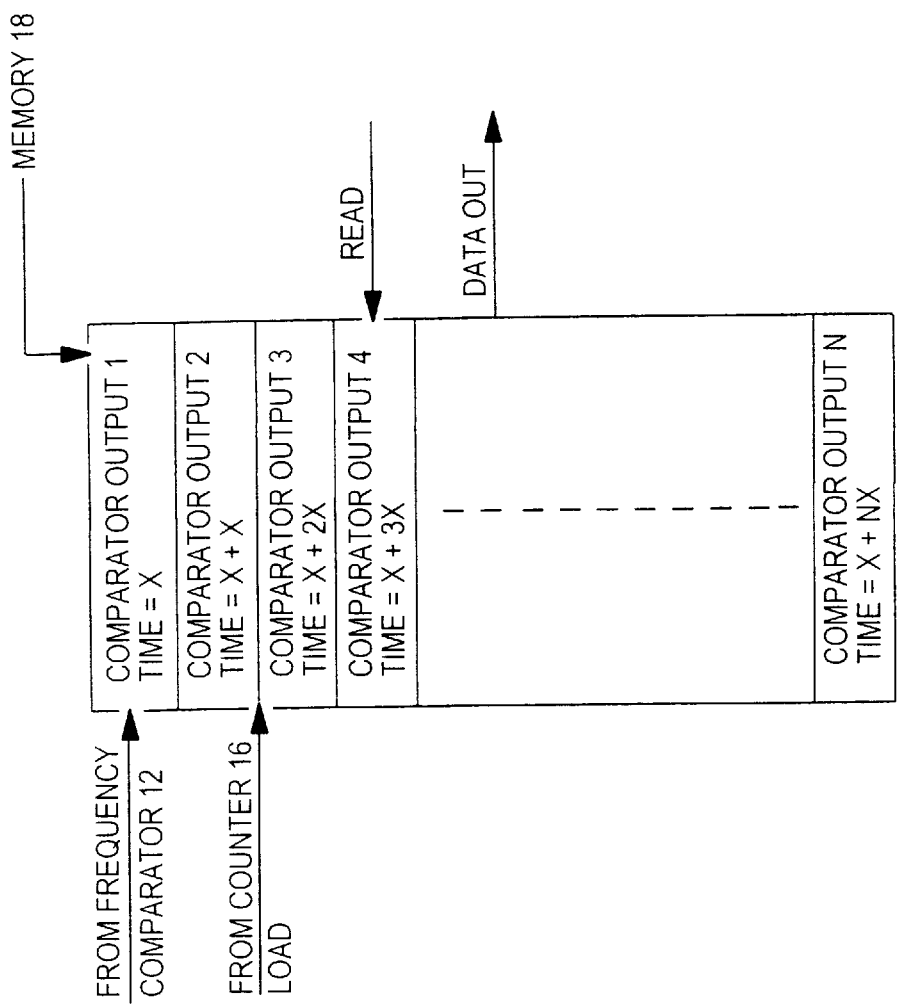
FIG. 3 is a block diagram of the memory of FIG. 1.

With reference to FIG. 3, the memory contains a history of values indicating the operating condition of the chip. The contents of memory 18 also contain a time stamp which indicates the operating conditions at that particular time. The memory 18 can be read out by applying a read signal to the memory 18. In addition, the memory 18 is shown on-chip, but could also be located off-chip. The memory 18 could even be located at a central diagnostic facility where the operating conditions of various chips are monitored.

The memory 18 functions as a diagnostic tool which may indicate what went wrong and why the chip failed to perform properly. In the event that a chip failure occurs, a diagnosis of the problem may begin with reading out the contents of the memory 18.

For example, assume that the chip stopped performing its logic functions at a time T without any outward indication of the problem. An initial diagnosis is performed on memory 18. A read signal is applied to the memory 18 and the contents of the memory 18 are read out. The values in memory 18 contain a time stamp which assists in the diagnosis. In this example, assume that the propagation delay of a signal through the pair of cascaded inverters is 100 picoseconds under standard operating conditions. If the frequency comparator 12 determines that the propagation delay through the pair of inverters at time T has slowed to 150 picoseconds, this is a 50% increase in the time needed to pass a signal through the inverters. Correspondingly, the other logic elements on the same silicon substrate will exhibit these same delays. Therefore, the contents of the memory 18 store a value indicating that the chip is running at a rate 50% below the standard rate. This may indicate to a troubleshooter that perhaps the temperature of the chip exceeded the chip threshold at time T. The contents of memory 18 may not be able to pinpoint the problem to any exact environmental factor, but gives an experienced designer a view of the overall chip conditions at the time of the failure. This indication is often enough to provide a clue as to the specific problem on the chip.

With reference to FIG. 4, the chip operating system recorder is shown integrated into a design which includes a delay line clock generator 14. The output of the frequency comparator 12 is used to determine the optimum clock frequency for the chip logic functions. The delay line clock generator 14 knows how much the delay cells have either slowed down or sped up in operation, in percentage deviation from the standard value. The delay line clock generator 14 adjusts the optimum operating frequency of the chip logic functions by this same percentage and generates a clock signal in the same way that the delay line oscillator generates a clock signal. Details of the construction and calibration of the delay line clock generator 14 are described more fully in co-pending application AMD docket number 1033-201, assigned to the assignee of the present invention, filed concurrently herewith and incorporated herein by reference. From FIG. 4, it is seen that the chip operating condition recorder system can be readily integrated into a digital design and does not require much increased processing or chip space.

Described has been a system and method for recording operating conditions of an integrated circuit chip. An advantage of the invention is that the recorder requires little processing and consumes little space on the chip. Another advantage of the invention is that the recorder uses only standard logic cells that can be readily integrated with the digital functions on the chip. In this disclosure, there is shown and described only the preferred embodiments of the invention, but, as aforementioned, it to be understood that the invention is capable of use in various other combinations and environments and is capable of changes or modifications within the scope of the inventive concept as expressed herein.

What is claimed is:

1. A condition recorder system, comprising:
    an oscillator located on a chip for generating a signal having a nominal frequency;
    a reference clock located off the chip for generating a signal having said nominal frequency;
    a comparator having a first input coupled to the oscillator and a second input coupled to the reference clock, for comparing the frequency of the oscillator to the frequency of the reference clock and for generating a value indicating the difference between the oscillator signal and the reference clock; and
    a memory coupled to the comparator and having an input for receiving the value from the comparator.

2. The condition recorder system of claim 1, further comprising a counter coupled to the reference clock and operative for generating a pulse each predetermined period of time.

3. The condition recorder system of claim 2, wherein the counter is operative for providing the pulse to the memory in order to write the comparator value to the memory.

4. The condition recorder system of claim 1, wherein the oscillator comprises N serially connected delay cells, wherein the delay cells are configured such that the propagation time of a signal through the N delay cells corresponds in value to ½ the period of the nominal frequency signal.

5. The condition recorder system of claim 1, wherein the memory is located on the chip.

6. The condition recorder system of claim 1, wherein the memory is located off-chip.

7. The condition recorder system of claim 1, wherein the comparator is operative for performing a comparison each predetermined period of time.

8. The condition recorder system of claim 1, wherein the memory is connected to receive and store a plurality of values from the comparator.

9. A method of recording chip operating conditions, comprising the steps of:
    a) generating an on-chip clock signal having a nominal frequency;
    b) comparing the frequency of the on-chip clock signal to the frequency of a reference clock;
    c) outputting the difference between the on-chip clock signal and the reference clock;
    d) storing the results of step c).

10. The method of claim 9, wherein step d) further comprises:
    storing the results of step c) each predetermined period of time.

11. A condition recorder system comprising:
    an oscillator located on a chip, the oscillator comprising N serially connected delay cells for generating a signal having a nominal frequency;
    a reference clock located off the chip for generating a signal having said nominal frequency;
    a comparator coupled to the oscillator and to the reference clock for comparing the frequency of the oscillator signal to the frequency of the reference clock, the comparator operative for generating a value indicating the difference between the oscillator signal and the reference clock;
    a memory coupled to the comparator and having an input for receiving the value from the comparator, the memory operative for storing a history of data values which indicate the operating conditions on the chip; and
    a counter coupled to the external clock for producing a pulse each predetermined period of time, wherein the counter is operative for providing the pulse to the memory in order to write the comparator value to the memory.

12. The condition recorder system of claim 11, wherein the memory is located on the chip.

13. The condition recorder system of claim 11, wherein the memory is located off-chip.

14. The condition recorder system of claim 11, including an output at which the contents of the memory are produced for read out.

15. The condition recorder system of claim 11, wherein each delay cell comprises a pair of serially connected inverters.

16. The condition recorder system of claim 11, wherein the contents of the memory include information indicating the time that the comparison is made.

* * * * *